United States Patent [19]

Wesner

[11] 4,031,417
[45] June 21, 1977

[54] APPARATUS FOR COUPLING A DIGITAL DATA GENERATOR TO A DIGITAL DATA READOUT DEVICE WITH ELECTRICAL ISOLATION THEREBETWEEN

[75] Inventor: Charles R. Wesner, Crozet, Va.

[73] Assignee: Sperry Rand Corporation, New York, N.Y.

[22] Filed: May 10, 1976

[21] Appl. No.: 684,991

[52] U.S. Cl. .............................. 307/311; 307/363; 307/255
[51] Int. Cl.² .................. H03K 17/60; H03K 03/42
[58] Field of Search ............ 307/311, 255, 235 WS

[56] References Cited
UNITED STATES PATENTS

| | | | |
|---|---|---|---|
| 3,693,027 | 9/1972 | Garaway | 307/311 UX |
| 3,767,978 | 10/1973 | Wernli | 307/311 |
| 3,848,140 | 11/1974 | Guermear et al. | 307/254 |

*Primary Examiner*—Stanley D. Miller, Jr.
*Assistant Examiner*—B. P. Davis
*Attorney, Agent, or Firm*—Howard P. Terry; Seymour Levine

[57] ABSTRACT

An apparatus for coupling digital data from a data generator to a readout device and providing electrical isolation therebetween. The apparatus including a control signal generator which couples digital data, representative of the data from the data generator, to a switch which responds thereto and couples data representative thereof to an isolation device. Operation of the switch is performed without external voltage supplies, all switching being accomplished entirely with the voltages coupled from the control signal generator to the switch. The isolation device converts the electrical signals to light signals that are then coupled to a light sensitive device which converts the light signals to digital electrical signals for coupling to the readout device.

6 Claims, 1 Drawing Figure

U.S. Patent
June 21, 1977
4,031,417
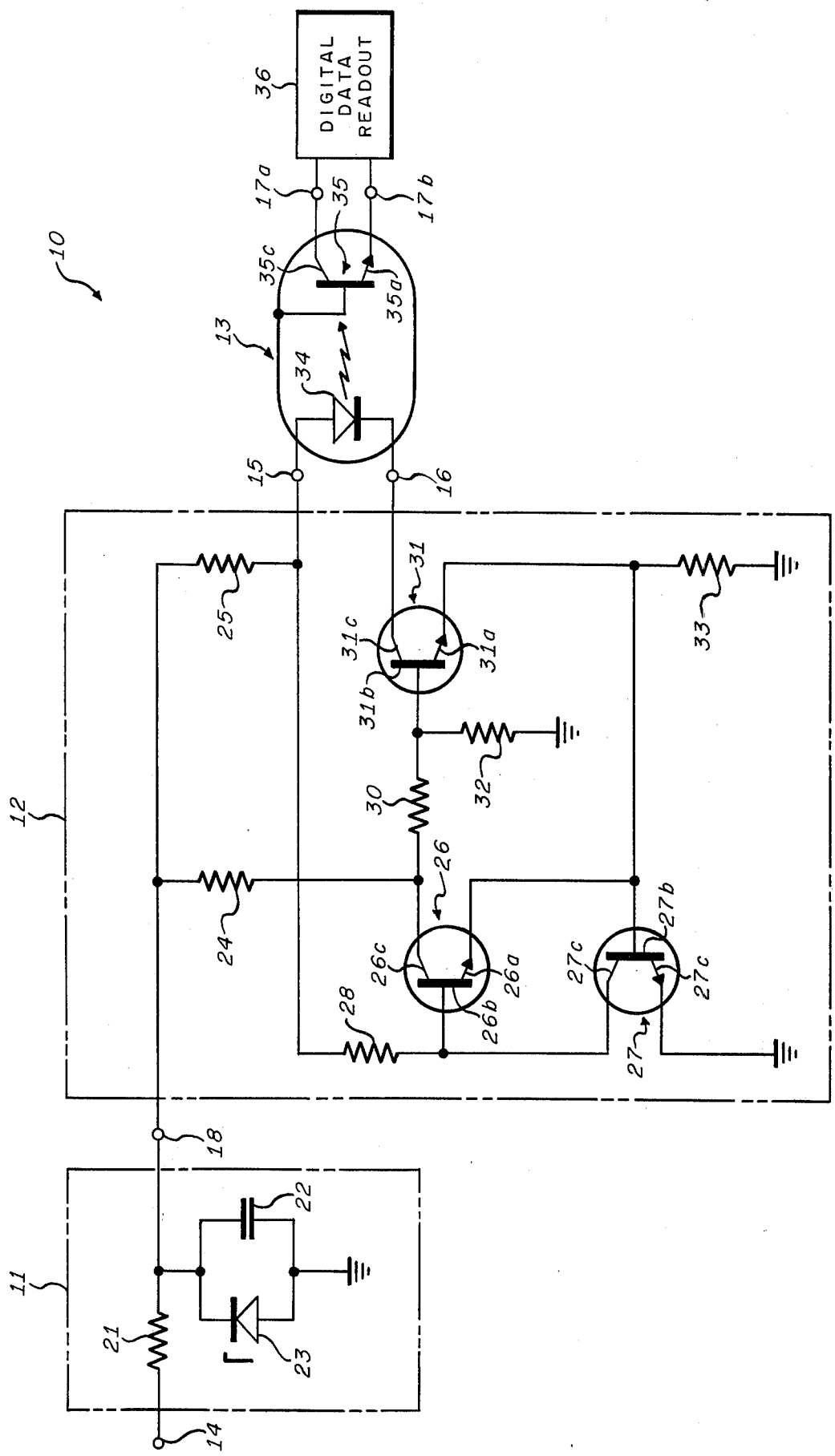

APPARATUS FOR COUPLING A DIGITAL DATA GENERATOR TO A DIGITAL DATA READOUT DEVICE WITH ELECTRICAL ISOLATION THEREBETWEEN

BACKGROUND OF THE INVENTION

1. Field of the Invention

The present invention relates to digital data readout devices and more particularly to apparatus for coupling digital data generators to digital data readout devices.

2. Description of the Prior Art

Step data gyrocompasses provide heading information by generating electrical output signals in the form of three phase displaced pulse modulated sixty or four hundred cycle signals. These pulse modulated alternating current signals are full wave rectified and the resulting pulses are coupled to a digital data readout device wherein they are processed and a visual representation of the heading is provided. Prior art methods of providing this digital data to the readout device, either directly coupled the data thereto or employed an attenuating coupler between the step data gyrocompass output terminal and the readout device without providing electrical isolation therebetween. State level switching in the readout device due to these rectified pulses, occurs when the leading edge crosses a given threshold and internal system noise, such as that caused by differential ground currents between the step data gyrocompass and a remotely located digital data readout device, may cause erratic processing of the compass step data and erroneous heading indications. To eliminate this erratic operation, it is required to provide electrical isolation between the gryocompass and the readout device and to establish a range within which switching is not accomplished. This range may be realized by providing switching action with hysteresis, that is, a first threshold level for switching from one logic state to another and providing a second threshold level for switching back.

It is the object of the present invention to provide a coupling device between a digital data generator and a digital data readout device to provide electrical isolation therebetween and to establish a first threshold level for switching from a first logic state to a second logic state and a second threshold level for switching from the second logic state to the first logic state.

SUMMARY OF THE INVENTION

The subject invention provides a means for coupling a digital data generator to a digital data output while providing electical isolation therebetween. Logic switching with hysteresis is accomplished in the coupler to eliminate erratic and erroneous data output. Digital signals from the data generator are coupled to a switch control element wherein noise filtering is accomplished and digital signals from the digital signal generator are clamped to a given level. The output signals from the switch control element are coupled to a switch wherein a feedback circuit provides the desired hysteresis for the logic state switching. An isolation element is coupled to the switch. This element provides electrical isolation between its output terminals and the preceding circuits and also provides an output signal, in response to the logic states generated by the switch, which are representative of the digital data from the digital data generator.

BRIEF DESCRIPTION OF THE DRAWING

The FIGURE shows a schematic diagram of a circuit embodying the principles of the invention.

DESCRIPTION OF THE PREFERRED EMBODIMENT

A step data gyrocompass provides heading information in the form of three phase displaced signals. In accordance with the present invention these three phase displaced signals are coupled to a compass heading indicator via three identical coupling devices. These coupling devices provide electrical isolation between the gyrocompass and the compass heading indicator and also provide digital data switching with hysteresis to eliminate erratic operation caused by system noise. A schematic of the device utilized for coupling each phase of the gyrocompass output to the compass heading indicator is shown in the drawing. It will become apparent that the circuit shown in the drawing may also be utilized for coupling other digital data generators to their associated digital data readout devices.

Referring to the drawing, a digital data coupler 10 includes a control signal filter 11, a switch 12 and an isolation coupler 13. A signal from a digital signal generator (not shown) is coupled to the input terminal 14 of the control signal filter 11. This input signal may be a pulse or a rectified pulse modulated a.c. signal and as such contain ripple and other noise components. The control signal filter 11 filters this coupled signal and provides a pulse representative thereof to the switch 12. When the representative pulse achieves a predetermined threshold level, switch 12 allows current to flow from terminal 15 of the switch 12 through the isolation coupler 13 to terminal 16 of the switch 12. This current activates the isolation coupler thereby providing a signal at terminals 17a and 17b that is representative of the digital data signal coupled to terminal 14.

The control signal filter 11 includes a resistor 21 having one terminal coupled to the input terminal 14, the other terminal of resistor 21 is coupled to ground via the parallel combination of capacitor 22 and Zener diode 23 and to the input terminal 18 of the switch 12. The switch 12 includes resistor 24, one terminal of which is coupled to input terminal 18 and to terminal 15 via resistor 25. The other terminal of resistor 24 is coupled to the collector 26c of transistor 26. Switch 12 also includes transistor 27, the base 27b of which is coupled to the emitter 26a of transistor 26 and the collector 27c of which is coupled to the base 26b of transistor 26 and to one terminal of resistor 28, the other terminal of which is coupled to terminal 15. A resistor 30 is coupled between the collector 26c of transistor 26 and the base 31b of transistor 31 which is coupled to ground via resistor 32. The emitter 31a of transistor 31 is coupled to the base 27b of transistor 27, to the emitter 26a of transistor 26 and to ground via resistor 33, while the collector 31c of transistor 31 is coupled to terminal 16. Coupled between terminals 15 and 16 is a light emitting diode 34 of the isolation coupler 13 which also includes photo-transistor 35, the collector 35c and the emitter 35a of which are coupled to the input terminals 17a and 17b of the digital data readout device.

Referring again to the FIGURE. When the digital data coupled to terminal 14 from the digital data generator (not shown) is at a low level, the voltage across capacitor 22 is low, the transistor 26 is conducting and the major current path, for the current flowing through resistor 24, is through transistor 26 and resistor 33. This establishes a base-emitter voltage for transistor 31 that is insufficient to turn it on and transistor 31 is held in a non-conducting state. As the signal at terminal 14 increases, the voltage across capacitor 22 increases causing the current through transistor 26 and resistor 33 to increase. The voltage level to which the voltage across capacitor 22 is permitted to rise is limited to a predetermined level by the Zener diode 23 which commences to conduct when the predetermined level is exceeded, thus maintaining the voltage across capacitor 22 at that level through the voltage at terminal 14 may continue to rise. The current increase through resistor 33 causes the voltage there to increase, thus raising the voltage at the base 27b of transistor 27. When this voltage approaches the threshold of conduction for transistor 27, transistor 27 begins to conduct and diverts current from the base 26b of transistor 26, drawing transistor 26 out of saturation and into a non-conducting state. When transistor 26 is cut-off, the current that flowed through resistor 24, transistor 26 and resistor 33 is caused to flow through resistor 24, resistor 30 and resistor 32. As this current increases, the voltage across resistor 32, which is the base 31b voltage of transistor 31, increases. When the base voltage approaches the threshold of conduction of transistor 31, transistor 31 conducts and a conduction path through resistor 25, the light emitting diode (LED) 34, transistor 31 and resistor 33 is established. When current flows through LED 34, light is emitted therefrom. This light impinges on photo-transistor 35 which then couples a high level signal to terminals 17a and 17b of the digital data readout 36. Though electrical isolation is provided by means of light coupling between the LED 34 and the photo-transistor 35, it should be apparent to those skilled in the art that other means such as Hall effect devices may have been employed to provide the desired electrical isolation.

When the input voltage at terminal 14 begins to decrease, the voltage across capacitor 22 decreases and the current through transistor 31 also decreases, which in turn decreases the voltage drop across resistor 33. When this voltage drops below the conduction threshold of transistor 27, transistor 27 falls out of conduction and an increase in the base current of transistor 26 is realized which allows it to conduct. When transistor 26 conducts, the voltage at the base 31b of transistor 31 is reduced below the conduction threshold and transistor 31 is turned off, causing the current through LED 34 to cease. At this point light is no longer emitted from LED 34 and photo-transistor 35 reverts to a low level state, thus coupling a low level signal to digital data readout 36 via terminals 17a and 17b. The voltage at terminal 14 for which this switching is accomplished is lower than the voltage thereat for which the initial switching occurs. As the current through transistor 27 is decreased, an increase in the base current of transistor 26 is realized which tends to switch transistor 26 back on. However, the current that flows through resistor 33, as a result of the conducting state of transistor 31, tends to maintain transistor 27 in the conducting state, thus delaying the turn-on of transistor 26 until the voltage at terminal 14 has decreased to a level below that for which transistor 26 is turned on. The switching performed by the switch 12 as described above is unique in that it is accomplished entirely with the input voltages suplied at terminal 14 and does not require external voltage supplies.

While the invention has been described in its preferred embodiment, it is to be understood that the words which have been used are words of description rather than limitation and that changes may be made within the purview of the appended claims without departing from the true scope and spirit of the invention in its broader aspects.

I claim:

1. An apparatus for coupling a digital data generator to a digital data readout device and for providing electrical isolation therebetween, said apparatus comprising:

means for providing a control signal in response to a data signal coupled from said digital data generator;

means coupled to said control means for switching from a first state to a second state when said control signal achieves a first predetermined level and from said second state to said first state when said control signal achieves a second predetermined level, said switching means including a first transistor having its collector coupled to said control means and its base coupled to said control means;

a second transistor having its collector coupled to said base of said first transistor, its base coupled to the emitter of said first transistor and the emitter coupled to ground; and a third transistor having its base coupled to ground and to said collector of said first transistor and its emitter coupled to ground and to said base of said transistor; and means for providing electrical isolation between said switch means and said digital data readout device and for coupling a signal, in response to said state of said switch means, to said digital data readout device, said coupled signal being representative of said data signal generated by said digital data generator, said isolation means having a first input terminal coupled to the base of said first transistor of said switch means and a second input terminal coupled to the collector of said third transistor of said switch means and having first and second output terminals coupled to said digital data readout device.

2. An apparatus for coupling a digital data generator to a digital data readout device in accordance with claim 1 wherein said isolation means includes means, coupled between said first and second input terminals, for producing a non-electrical signal in response to one of said states of said switch means and means responsive to said non-electrical signal coupled between said first and second output terminals, for producing an electrical signal between said first and second output terminals.

3. An apparatus for coupling a digital data generator to a digital data readout device in accordance with claim 3 wherein said means for producing a non-electric signal in response to one of said states of said switch means and said means responsive to said non-electrical signal comprise a light-emitting diode and a photo-transistor coupled pair.

4. An apparatus for coupling a digital data generator to a digital data readout device in accordance with claim 1 wherein said control means include means for filtering noise from said digital data signal.

5. An apparatus for coupling a digital data generator to a digital data readout device in accordance with claim 4 wherein said control means further includes means for clamping said control signal to a predetermined level.

6. An apparatus for coupling a digital data generator to a digital data readout device in accordance with claim 5 wherein said means for producing a non-electrical signal in response to one of said states of said switch means and said means responsive to said non-electrical signals are a light emitting diode and phototransistor coupled pair.

* * * * *